United States Patent
Yoon et al.

(10) Patent No.: US 7,177,192 B2
(45) Date of Patent: Feb. 13, 2007

(54) METHOD OF OPERATING A FLASH MEMORY DEVICE

(75) Inventors: Jae-Man Yoon, Seoul (KR); Eun-Suk Cho, Suwon-si (KR); Dong-Gun Park, Seongnam-si (KR); Choong-Ho Lee, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/274,310

(22) Filed: Nov. 16, 2005

(65) Prior Publication Data

US 2006/0104116 A1    May 18, 2006

(30) Foreign Application Priority Data

Nov. 17, 2004    (KR) .................... 10-2004-0093845

(51) Int. Cl.
*G11C 11/34*    (2006.01)
(52) U.S. Cl. .............................. 365/185.17; 365/185.33
(58) Field of Classification Search ........... 365/185.17, 365/185.33
See application file for complete search history.

(56) References Cited

U.S. PATENT DOCUMENTS

| | | | |
|---|---|---|---|
| 3,982,138 A * | 9/1976 | Luisi et al. ................... 326/97 |
| 5,369,608 A * | 11/1994 | Lim et al. .............. 365/185.13 |
| 6,670,240 B2 | 12/2003 | Ogura et al. |
| 2001/0005015 A1* | 6/2001 | Futatsuyama et al. ......... 257/1 |
| 2004/0201399 A1* | 10/2004 | Sher et al. .................. 324/765 |

FOREIGN PATENT DOCUMENTS

| | | |
|---|---|---|
| JP | 2004-031982 | 1/2004 |
| KR | 1020040007867 | 1/2004 |

* cited by examiner

*Primary Examiner*—Michael Tran
(74) *Attorney, Agent, or Firm*—Volentine & Whitt, P.L.L.C.

(57) ABSTRACT

A method of operating a NAND flash memory device that comprising a unit string comprising a string selection transistor connected to a bit line, a cell transistor connected to the string selection transistor, and a ground selection transistor connected to the cell transistor is provided. The method comprises applying a negative bias voltage to the string selection transistor and the ground selection transistor in a stand-by mode of the NAND flash memory device.

18 Claims, 3 Drawing Sheets

METHOD OF OPERATING A FLASH MEMORY DEVICE

BACKGROUND OF THE INVENTION

1. Field of the Invention

The present invention relates to a method of operating a flash memory device, and more particularly, to a method of operating a flash memory device that is capable of readily controlling the threshold voltages of a string selection transistor and a ground selection transistor.

This application claims priority to Korean Patent Application No. 2004-93845, filed on Nov. 17, 2004, the subject matter of which is hereby incorporated by reference in its entirety.

2. Description of the Related Art

In general, flash memory devices are non-volatile memory devices, and have been widely used in digital cameras, computers, mobile phones, memory cards, etc. Each flash memory device can be classified as either a NOR flash memory device or a NAND flash memory device.

It is difficult to integrate NOR flash memory devices because a contact hole must be formed in the source/drain region of each constituent cell transistor. In contrast, however, it is relatively easy to integrate NAND flash memory devices which in conventional form include a string structure comprising a plurality of series connected cell transistors.

Each string structure of a NAND flash memory device also comprises a connected combination of a string selection transistor and a ground selection transistor. In contrast to the cell transistors forming the data storage mechanism on the NAND flash memory device which typically comprise a tunnel oxide layer, a floating gate electrode formed on the tunnel oxide layer, a dielectric layer formed on the floating gate electrode, and a control gate electrode formed on the dielectric layer, the string selection and ground selection transistors each comprise a tunnel oxide layer and a gate electrode formed on the tunnel oxide layer.

A cell transistor in a NAND flash memory device stores data in accordance with its threshold voltage. That is, electrical charge developed on the floating gate electrode of the cell transistor establishes the threshold voltage of the cell transistor. The threshold voltage indicates a logic state for the cell transistor as it varies between a program state and an erase state. Conventionally, the erase state has a relatively low threshold voltage and represents a logically low data bit value of "0," while the program state has a relatively high threshold voltage and represents a logically high data bit data value of "1."

When operating a NAND flash memory device, the respective threshold voltages of the cell transistors may be readily (i.e., easily or conveniently) controlled, since the cell transistors each comprise a floating gate electrode or a dielectric layer capable of trapping electrical charge. However, since the string selection transistor and the ground selection transistor each comprise but a single gate electrode without a floating gate electrode or a dielectric layer, the respective threshold voltages of the string selection and ground selection transistors are not readily controllable. Thus, a NAND flash memory device comprising the string selection transistor and the ground selection transistor tends to malfunction frequently. Particularly, when the threshold voltages of the string selection transistor and the ground selection transistor are low, the string selection transistor and the ground selection transistor undesirably turn on, so the NAND flash memory device tends to malfunction frequently.

In order to control the respective threshold voltages of the string selection and ground selection transistors, and thus suppress the malfunctioning problem inherent in these type of NAND flash memory devices, impurities are selectively implanted (i.e., implanted using conventional ion implantation techniques) into a substrate region in which the string selection and ground selection transistors are formed.

However, since the ion implantation process constitutes an additional fabrication step, otherwise unneeded in the formation of the NAND flash memory device cell transistors, and since the ion implantation is conventionally performed on a substrate region in which the string selection and ground selection transistors are formed, the conventional remediation scheme addressing the malfunctioning problem inhibits the integration of conventional NAND flash memory devices. As a result, the threshold voltages associated with the string selection and ground selection transistors are not readily controllable, so the conventional NAND flash memory device has inferior electrical reliability.

SUMMARY OF THE INVENTION

Embodiments of the invention provide NAND flash memory devices and related methods of operation which address the problem on malfunctioning as the result of poorly controlled threshold voltages for string selection and ground selection transistors.

In one embodiment, the invention provides a method of operating a flash memory device that comprises a unit string. The unit string comprises a string selection transistor comprising a first gate structure and electrically connected to a bit line, a cell transistor electrically connected to the string selection transistor, and a ground selection transistor comprising a second gate structure and electrically connected to the cell transistor. The method comprises applying a negative bias voltage to the first and second gate structures when the device is operating in a stand-by mode.

In a related aspect, embodiments of the invention a method of operating a flash memory device in which a stand-by mode of operation is provided before a cell transistor in the flash memory device is erased or programmed. During the stand-by mode, a negative bias voltage is applied to the string selection and ground selection transistors.

BRIEF DESCRIPTION OF THE DRAWINGS

Exemplary embodiments of the invention will be described in detail with reference to the accompanying drawings, in which like reference symbols indicate like elements. In the drawings.

DESCRIPTION OF EXEMPLARY EMBODIMENTS

Throughout this description of exemplary embodiments, it is understood that when an element or layer is referred to as being "on" or "connected to" another element or layer, it may be formed directly on, or connected directly to the other element, or the element or layer may be formed on or connected to another element or layer through intervening elements or layers. In contrast, when an element is referred to as being "directly on" or "directly connected to" another element or layer, there are no intervening elements or layers present.

Figure 1:
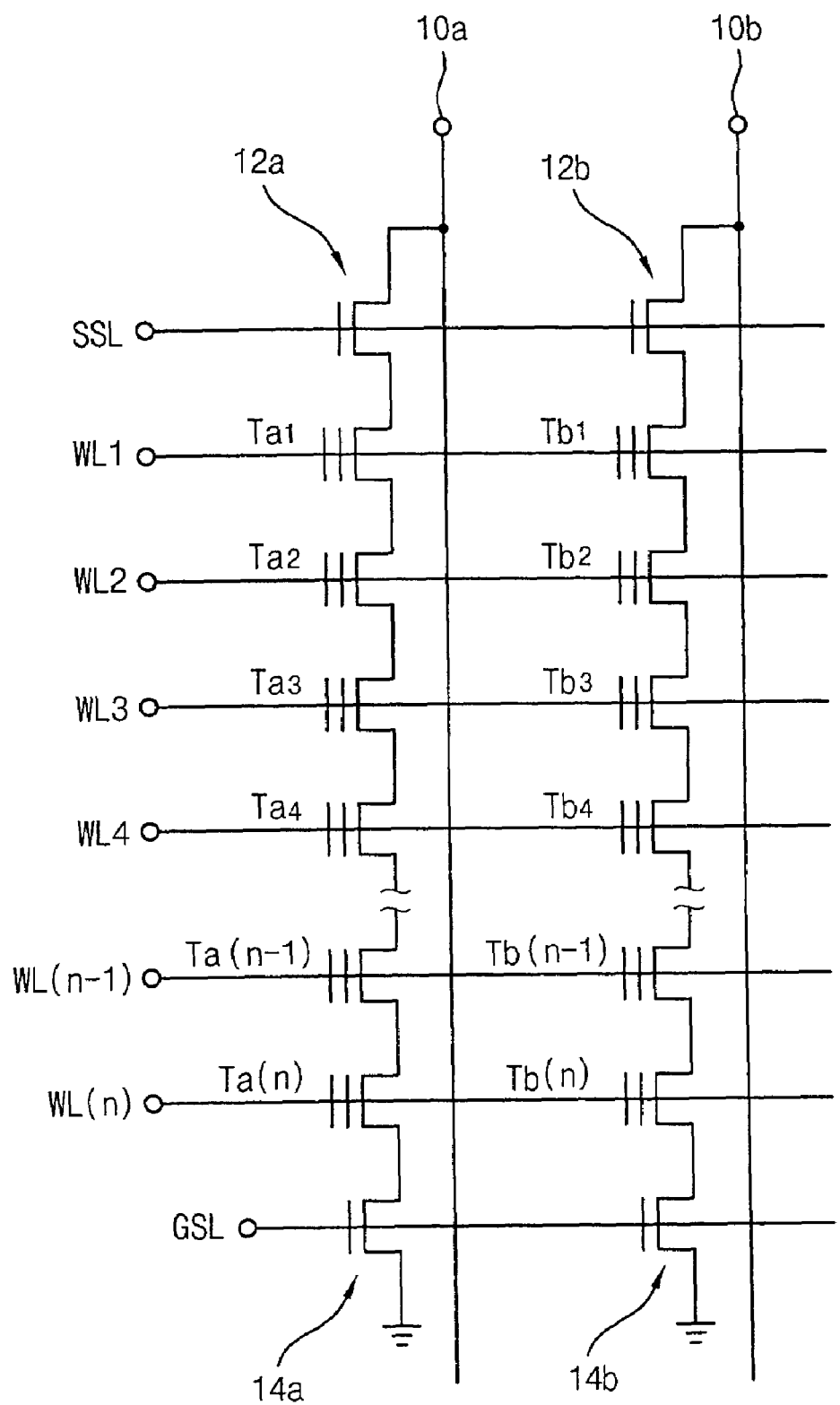
FIG. 1 is a circuit diagram of an exemplary circuit adapted for use with a method of operating a flash memory device in accordance with one embodiment of the present invention.

FIG. 1 is a circuit diagram of an exemplary circuit adapted for use with a method of operating a flash memory device in accordance with one embodiment of the present invention.

Referring to FIG. 1, the exemplary NAND flash memory device comprises two unit strings. A first unit string comprises string selection transistor 12a connected to bit line 10a, cell transistors $T_{a1}$, $T_{a2}$, ..., $T_{a(n-1)}$, and $T_{a(n)}$, and ground selection transistor 14a connected to cell transistors $T_{a1}$, $T_{a2}$, ..., $T_{a(n-1)}$, and $T_{a(n)}$, wherein string selection transistor 12a, cell transistors $T_{a1}$, $T_{a2}$, ..., $T_{a(n-1)}$, and $T_{a(n)}$, and ground selection transistor 14a are connected in series. A second unit string comprises string selection transistor 12b connected to bit line 10b, cell transistors $T_{b1}$, $T_{b2}$, ..., $T_{b(n-1)}$, and $T_{b(n)}$, and ground selection transistor 14b connected to cell transistors $T_{b1}$, $T_{b2}$, ..., $T_{b(n-1)}$, and $T_{b(n)}$, wherein string selection transistor 12b, cell transistors $T_{b1}$, $T_{b2}$, ..., $T_{b(n-1)}$, and $T_{b(n)}$, and ground selection transistor 14b are connected in series.

Cell transistors $T_{a1}$, $T_{a2}$, ..., $T_{a(n-1)}$, and $T_{a(n)}$ and $T_{b1}$, $T_{b2}$, ..., $T_{b(n-1)}$, $T_{b(n)}$ may comprise planar cell transistors, vertical cell transistors, and/or fin cell transistors, etc.

Figure 2:
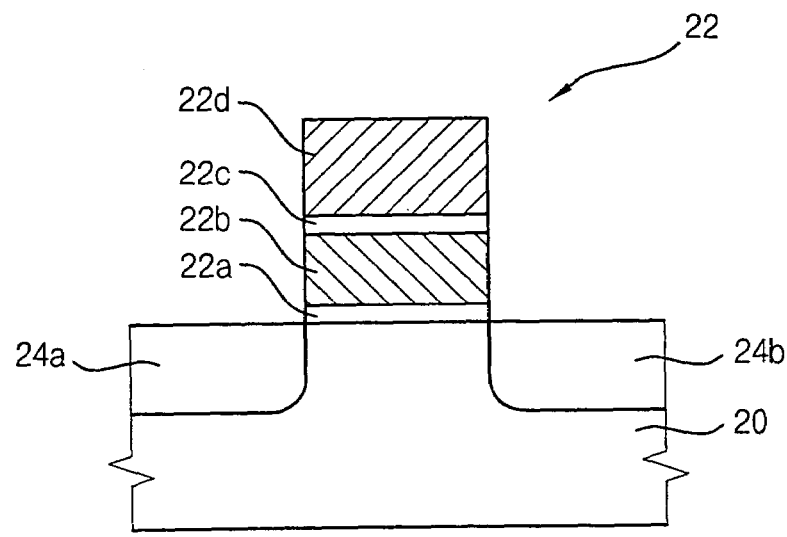
FIG. 2 is a cross sectional view illustrating a planar gate structure of the flash memory device in FIG. 1.

The exemplary planar cell transistor of FIG. 2 comprises a gate structure 22 formed on a semiconductor substrate 20. Gate structure 22 comprises a tunnel oxide layer 22a, a first gate electrode 22b adapted to function as a floating gate electrode, a dielectric layer 22c, and a second gate electrode 22d adapted to function as a control gate electrode all sequentially formed on semiconductor substrate 20. Also, source/drain regions 24a and 24b are formed in surface portions of semiconductor substrate 20 on opposite sides of gate structure 22.

Figure 3:
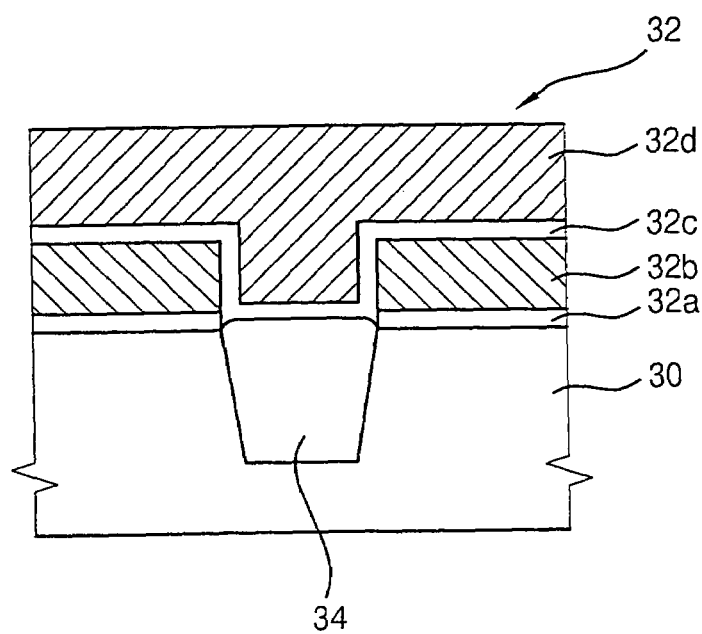
FIG. 3 is a cross sectional view illustrating a vertical gate structure of the flash memory device in FIG 1; and, FIG. 4 is a perspective view illustrating a fin gate structure of the flash memory device in FIG. 1.

The exemplary vertical cell transistor of FIG. 3 comprises a gate structure 32 formed on a semiconductor substrate 30. Gate structure 32 comprises a tunnel oxide layer 32a, a first gate electrode 32b adapted to function as a floating gate electrode and oriented in a first direction, a dielectric layer 32c oriented in a second direction substantially perpendicular to the first direction, and a second gate electrode 32d adapted to function as a control gate electrode, wherein the layers are all sequentially formed on semiconductor substrate 30. A trench isolation layer 34 is formed between the first gate electrodes 32b. Tunnel oxide layer 32a is formed in a third direction substantially perpendicular to the first direction.

Figure 4:
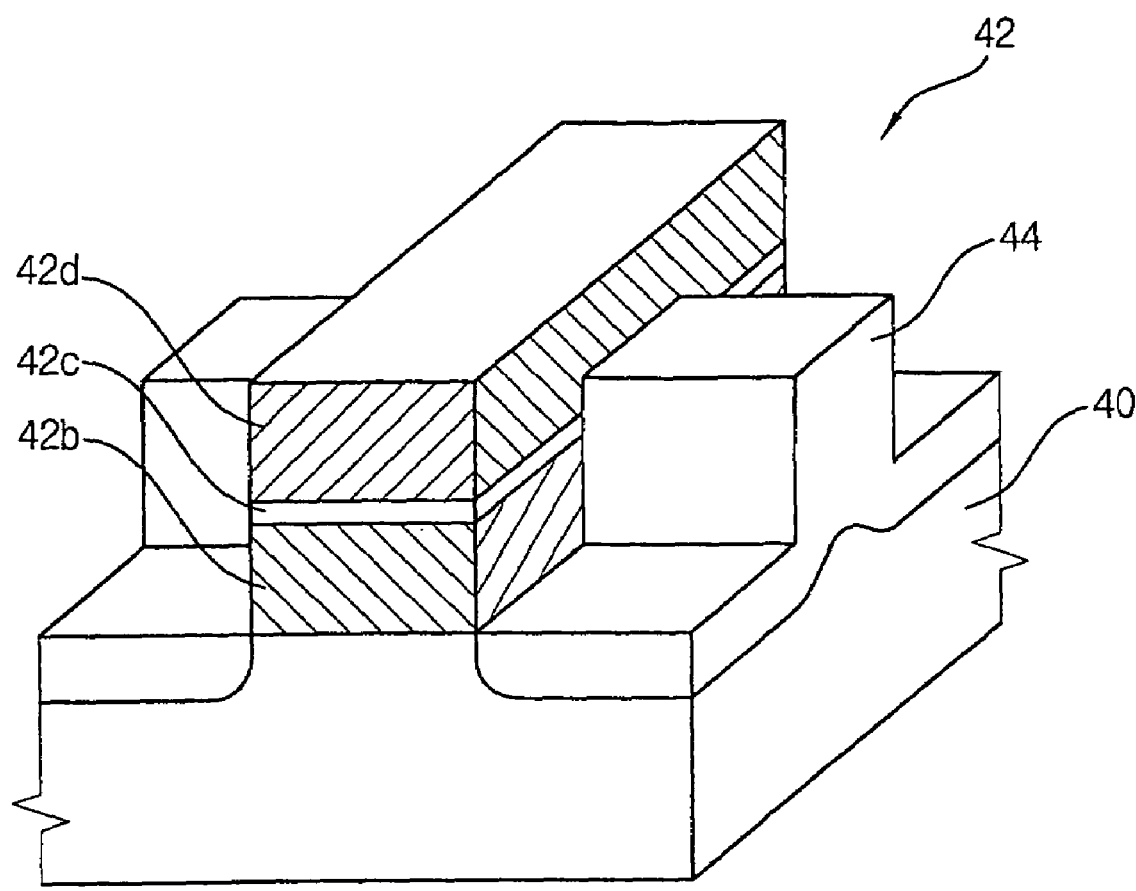

The exemplary fin cell transistor of FIG. 4 comprises a gate structure 42 formed on a semiconductor substrate 40. Gate structure 42 comprises a first gate electrode 42b adapted to function as a floating gate electrode oriented in a direction substantially perpendicular to source/drain regions 44, which protrude vertically from semiconductor substrate 40. Gate structure 42 further comprises a dielectric layer 42c, and a second gate electrode 42d adapted to function as a control gate electrode. A tunnel oxide layer (not shown) is formed between semiconductor substrate 40 and first gate electrode 42b.

In cell transistors $T_{a1}$, $T_{a2}$, ..., $T_{a(n-1)}$, and $T_{a(n)}$ and $T_{b1}$, $T_{b2}$, ..., $T_{b(n-1)}$, and $T_{b(n)}$, first and second gate electrodes 42b and 42d comprise a polysilicon layer. In addition, dielectric layer 42c comprises an oxide/nitride/oxide (ONO) layer.

Further, string selection transistors 12a and 12b and ground selection transistors 14a and 14b may comprise planar transistors, vertical transistors, and/or fin transistors, etc. However, the gate structures of string selection transistors 12a and 12b and ground selection transistors 14a and 14b each comprise but a tunnel oxide layer and a gate electrode and do not comprise a dielectric layer, in contrast to cell transistors $T_{a1}$, $T_{a2}$, ..., $T_{a(n-1)}$, and $T_{a(n)}$ and $T_{b1}$, $T_{b2}$, ..., $T_{b(n-1)}$, and $T_{b(n)}$.

Thus, a planar string selection transistor and a planar ground selection transistor each comprise a gate structure comprising a tunnel oxide layer and a gate electrode formed on the tunnel oxide layer. A vertical string selection transistor and a vertical ground selection transistor each comprise a gate structure comprising a tunnel oxide layer, and a gate electrode oriented in a direction substantially perpendicular to the tunnel oxide layer. A fin string selection transistor and a fin ground selection transistor each comprise a gate structure comprising a tunnel oxide layer and a gate electrode, wherein the tunnel oxide layer and the gate electrode are each oriented in a direction substantially perpendicular to a channel region that vertically protrudes from a semiconductor substrate.

Also, the gate electrode of each of string selection transistors 12a and 12b is electrically connected to string selection line SSL. The gate electrode of each of ground selection transistors 14a and 14b is electrically connected to ground selection line GSL. Further, string selection line SSL and ground selection line GSL are substantially parallel with each other. Word lines WL1, WL2, ..., WL(n-1), and WL(n) are positioned between string selection line SSL and ground selection line GSL. Further, word lines WL1, WL2, ..., WL(n-1), and WL(n) are electrically connected to the control gates of cell transistors $T_{a1}$, $T_{a2}$, ..., $T_{a(n-1)}$, and $T_{a(n)}$, respectively, and are electrically connected to the control gates of cell transistors $T_{b1}$, $T_{b2}$, ..., $T_{b(n-1)}$, and $T_{b(n)}$, respectively.

Bit line 10a is electrically connected to a drain region of string selection transistor 12a, and bit line 10b is electrically connected to a drain region of string selection transistor 12b. In addition, bit lines 10a and 10b cross word lines WL1, WL2, ..., WL(n-1), and WL(n). A common source line (not shown) is electrically connected to a source region of ground selection transistor 14a and a source region of ground selection transistor 14b. In this exemplary embodiment, the common source line is substantially parallel with the ground selection lines GSL.

Hereinafter, exemplary operations of the NAND flash memory device will be described in detail with reference to FIG. 1. For convenience of description, exemplary erase, program, and read operations will be described as performed on a selected cell transistor $T_{a4}$.

To erase selected cell transistor $T_{a4}$ of the NAND flash memory device of FIG. 1, a voltage of about 0V is applied to a selected word line WL4, which is electrically connected to selected cell transistor $T_{a4}$. Also, a voltage of about 20V is applied to the semiconductor substrate. The voltages applied create a voltage difference between both ends of the tunnel oxide layer so that electrons in the floating gate electrode move into the semiconductor substrate through a Fowler-Nordheim tunneling effect. When erased, the threshold voltage of selected cell transistor $T_{a4}$ is about −3V.

To program selected cell transistor $T_{a4}$ of the NAND flash memory device, a voltage of about 20V is applied to selected word line WL4, which is electrically connected to selected cell transistor $T_{a4}$. Also, a voltage of about 0V is applied to the semiconductor substrate. Thus, electrons move from the semiconductor substrate into the floating gate of the selected cell transistor $T_{a4}$. When programmed, the threshold voltage of the selected cell transistor $T_{a4}$ is about 1V.

To prevent a non-selected cell transistor $T_{b4}$, which is electrically connected to the selected word line WL4, from being programmed when the voltage of about 20V is applied to the selected word line WL4 in the exemplary programming operation described previously, a voltage of about 10V is applied to a non-selected bit line 10b. When the voltage of about 10V is applied to non-selected bit line 10b, a voltage of about 10V is simultaneously applied to word lines WL1, WL2, and WL3 between the string selection line SSL and selected word line WL4 in order to apply the voltage of the non-selected bit line to non-selected cell transistor $T_{b4}$. Thus, a voltage of about 12V is induced in the floating gate of the non-selected cell transistor $T_{b4}$ by a coupling ratio. As a result, the voltage difference between the floating gate of non-selected cell transistor $T_{b4}$ and the semiconductor substrate is reduced, relative to the voltage difference between the floating gate of selected cell transistor $T_{a4}$ and the semiconductor substrate. Thus, electrons do not move into the floating gate of non-selected cell transistor $T_{b4}$, so non-selected cell transistor $T_{b4}$ is not programmed.

Data stored in a cell transistor of the NAND flash memory device is read by detecting the threshold voltage of the cell transistor. For example, when reading the data stored in selected cell transistor $T_{a4}$, a voltage of about 4.5V is applied to selected bit line 10a, ground selection line GSL, and each word line except selected word line WL4 that corresponds to selected cell transistor $T_{a4}$. A voltage of about 0V is applied to selected word line WL4. As a result, current either flows or not through bit line 10a in accordance with the threshold voltage of selected cell transistor $T_{a4}$. The flow of current is detected in order to read the data stored in selected cell transistor $T_{a4}$ of the NAND flash memory device.

However, since the respective threshold voltages of the string selection transistors and the ground selection transistors are not readily controlled, the flash memory device may malfunction. Particularly, when the threshold voltages of the string selection transistor and the ground selection transistor are low and voltages applied to gate electrodes of the string selection transistor and the ground selection transistor are relatively high, the string selection transistor and the ground selection transistor undesirably turn on, so the NAND flash memory device tends to malfunction frequently.

Therefore, in a stand-by mode before operating the flash memory device, a negative bias voltage is applied to the gate electrodes of string selection transistors 12a and 12b and ground selection transistors 14a and 14b. In the present exemplary embodiment, the negative bias voltage is about −0.3V. With application of this negative bias voltage, the threshold voltages of string selection transistor 12a and 12b and ground selection transistors 14a and 14b may be more readily controlled.

In accordance with the present invention, although the threshold voltages of the string selection and ground selection transistors are low, the flash memory device may operate normally. As a result, the electrical reliability of the NAND flash memory device may be improved.

Having described exemplary embodiments of the present invention, it will be understood by those of ordinary skill in the art that modifications and variations can be made in the exemplary embodiments of the present invention while remaining within the scope of the present invention as defined by the appended claims.

What is claimed is:

1. A method of operating a flash memory device comprising a unit string, the unit string comprising;
   a string selection transistor comprising a first gate structure and electrically connected to a bit line,
   a cell transistor electrically connected to the string selection transistor, and
   a ground selection transistor comprising a second gate structure and electrically connected to the cell transistor, the method comprising:
   applying a negative bias voltage to the first and second gate structures during a stand-by mode.

2. The method of claim 1, wherein the string selection transistor, the cell transistor, and the ground selection transistor are electrically connected in series.

3. The method of claim 1, wherein the first and second gate structures respectively comprise a tunnel oxide layer and a gate electrode.

4. The method of claim 1, wherein the first and second gate structures respectively comprise a fin structure comprising a vertical channel region, and a gate electrode oriented in a direction substantially perpendicular to the channel region.

5. The method of claim 1, wherein the first and second gate structures respectively comprise a planar structure comprising a tunnel oxide layer and a gate electrode formed on the tunnel oxide layer.

6. The method of claim 1, wherein the first and second gate structures respectively comprise a vertical structure comprising a tunnel oxide layer oriented in a first direction and a gate electrode formed on the tunnel oxide layer and oriented in a second direction substantially perpendicular to the first direction.

7. The method of claim 1, wherein the number of the cell transistors is at least two.

8. The method of claim 1, wherein the cell transistor comprises a gate structure comprising a tunnel oxide layer, a first gate electrode formed on the tunnel oxide layer, a dielectric layer formed on the first gate electrode, and a second gate electrode formed on the dielectric layer.

9. The method of claim 8, wherein the gate structure comprises a fin structure comprising a vertical channel region, and a gate electrode oriented in a direction substantially perpendicular to the channel region.

10. The method of claim 8, wherein the gate structure comprises a planar structure comprising a tunnel oxide layer and a gate electrode formed on the tunnel oxide layer.

11. The method of claim 8, wherein the gate structure comprises a vertical structure comprising a tunnel oxide layer oriented in a first direction and a gate electrode formed on the tunnel oxide layer and oriented in a second direction substantially perpendicular to the first direction.

12. The method of claim 8, wherein the first and second gate electrodes each comprise a polysilicon layer, and the dielectric layer comprises an oxide/nitride/oxide (ONO) layer.

13. The method of claim 3, wherein the negative bias voltage is applied to the gate electrodes of the first and second gate structures during the standby mode.

14. A method of operating a flash memory device comprising a unit string, the unit string comprising;
   a string selection transistor comprising a first gate structure and electrically connected to a bit line,
   a cell transistor electrically connected to the string selection transistor, and
   a ground selection transistor comprising a second gate structure and electrically connected to the cell transistor, the method comprising:
   providing a stand-by mode before erasing the cell transistor or programming the cell transistor; and,
   applying a negative bias voltage to at least one of the first and second gate structures of the string selection transistor and the ground selection transistor during the stand-by mode.

15. The method of claim 14, wherein the string selection transistor, the cell transistor, and the ground selection transistor are electrically connected in series, and the negative bias voltage is applied to the first and second gate structures of the string selection transistor and the ground selection transistor.

16. The method of claim 15, wherein the first and second gate structures respectively comprise a fin structure comprising a vertical channel region, and a gate electrode oriented in a direction substantially perpendicular to the channel region.

17. The method of claim 15, wherein the first and second gate structures respectively comprise a planar structure comprising a tunnel oxide layer and a gate electrode formed on the tunnel oxide layer.

18. The method of claim 15, wherein the first and second gate structures respectively comprise a vertical structure comprising a tunnel oxide layer oriented in a first direction and a gate electrode formed on the tunnel oxide layer and oriented in a second direction substantially perpendicular to the first direction.

* * * * *